(12) United States Patent
Chen et al.

(10) Patent No.: US 11,503,712 B2
(45) Date of Patent: Nov. 15, 2022

(54) PASSIVE DEVICE PACKAGING STRUCTURE EMBEDDED IN GLASS MEDIUM AND METHOD FOR MANUFACTURING THE SAME

(71) Applicant: Zhuhai ACCESS Semiconductor Co., Ltd, Guangdong (CN)

(72) Inventors: Xianming Chen, Guangdong (CN); Yejie Hong, Guangdong (CN); Benxia Huang, Guangdong (CN); Lei Feng, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 0 days.

(21) Appl. No.: 17/403,034

(22) Filed: Aug. 16, 2021

(65) Prior Publication Data
US 2022/0053644 A1   Feb. 17, 2022

(30) Foreign Application Priority Data
Aug. 14, 2020   (CN) .......................... 202010819722.5

(51) Int. Cl.
| | | |
|---|---|---|
| H05K 1/16 | (2006.01) | |
| H05K 1/03 | (2006.01) | |
| H05K 1/11 | (2006.01) | |
| H05K 3/00 | (2006.01) | |
| H05K 3/06 | (2006.01) | |
| H05K 3/40 | (2006.01) | |
| H05K 3/46 | (2006.01) | |

(52) U.S. Cl.
CPC .......... *H05K 1/162* (2013.01); *H05K 1/0306* (2013.01); *H05K 1/115* (2013.01); *H05K 1/165* (2013.01); *H05K 3/0047* (2013.01); *H05K 3/064* (2013.01); *H05K 3/4038* (2013.01); *H05K 3/4644* (2013.01); *H05K 2201/09545* (2013.01); *H05K 2203/107* (2013.01)

(58) Field of Classification Search
CPC ...... H05K 1/162; H05K 1/0306; H05K 1/165; H05K 3/4038; H05K 2201/0317; H05K 3/4697
See application file for complete search history.

(56) References Cited

U.S. PATENT DOCUMENTS

| | | | |
|---|---|---|---|
| 2017/0077079 A1* | 3/2017 | Lan | H01L 23/5223 |
| 2020/0219968 A1* | 7/2020 | Liu | H01L 21/02181 |
| 2020/0275558 A1* | 8/2020 | Fujita | H01G 4/232 |

FOREIGN PATENT DOCUMENTS

CN          103985698 A          8/2014

* cited by examiner

*Primary Examiner* — Sherman Ng
(74) *Attorney, Agent, or Firm* — The PL Law Group, PLLC

(57) ABSTRACT

A passive device packaging structure embedded in a glass medium according to an embodiment of the present disclosures includes a glass substrate and at least one capacitor embedded in the glass substrate. The capacitor includes an upper electrode, a dielectric layer, and a lower electrode. The glass substrate is provided on its upper surface with a cavity, the dielectric layer covers a surface of the cavity and has an area larger than that of the cavity. The upper electrode is provided on the dielectric layer. The dielectric layer and the lower electrode are connected by a metal via pillar passing through the glass substrate.

20 Claims, 15 Drawing Sheets

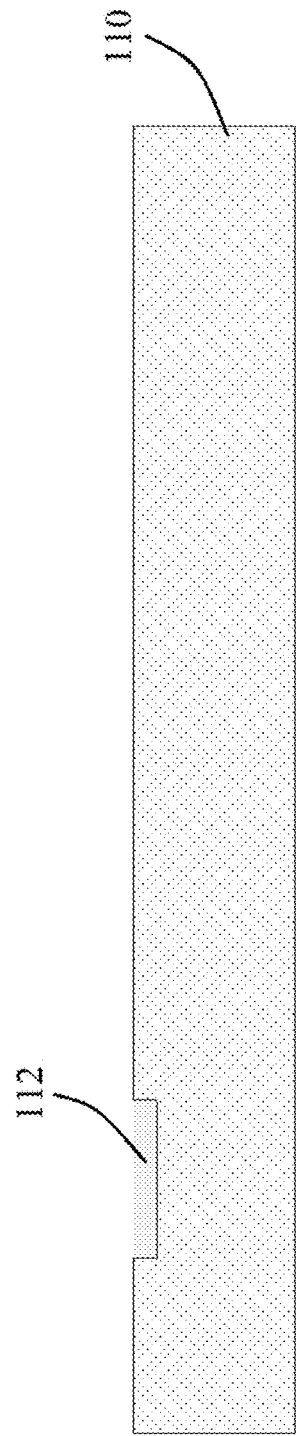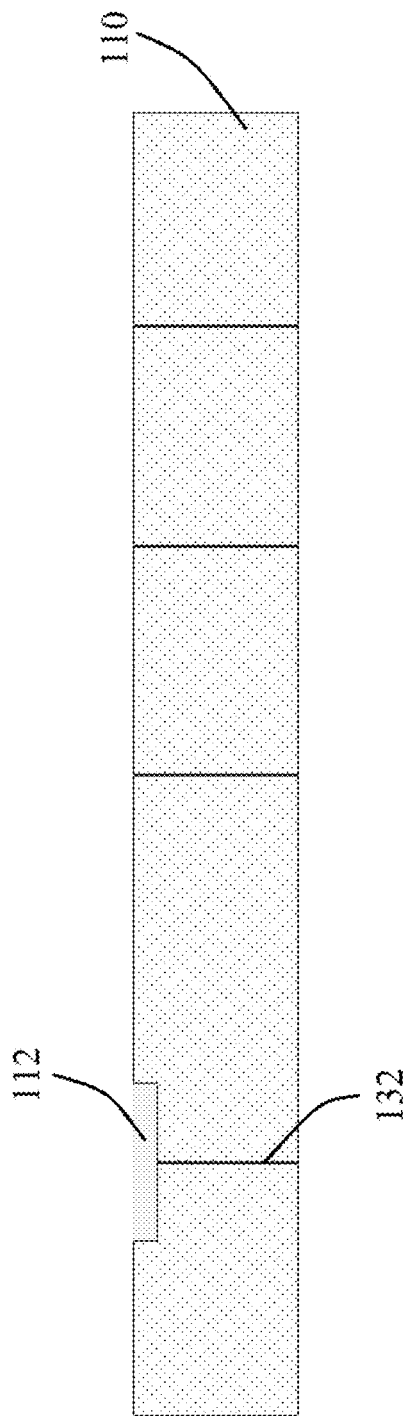

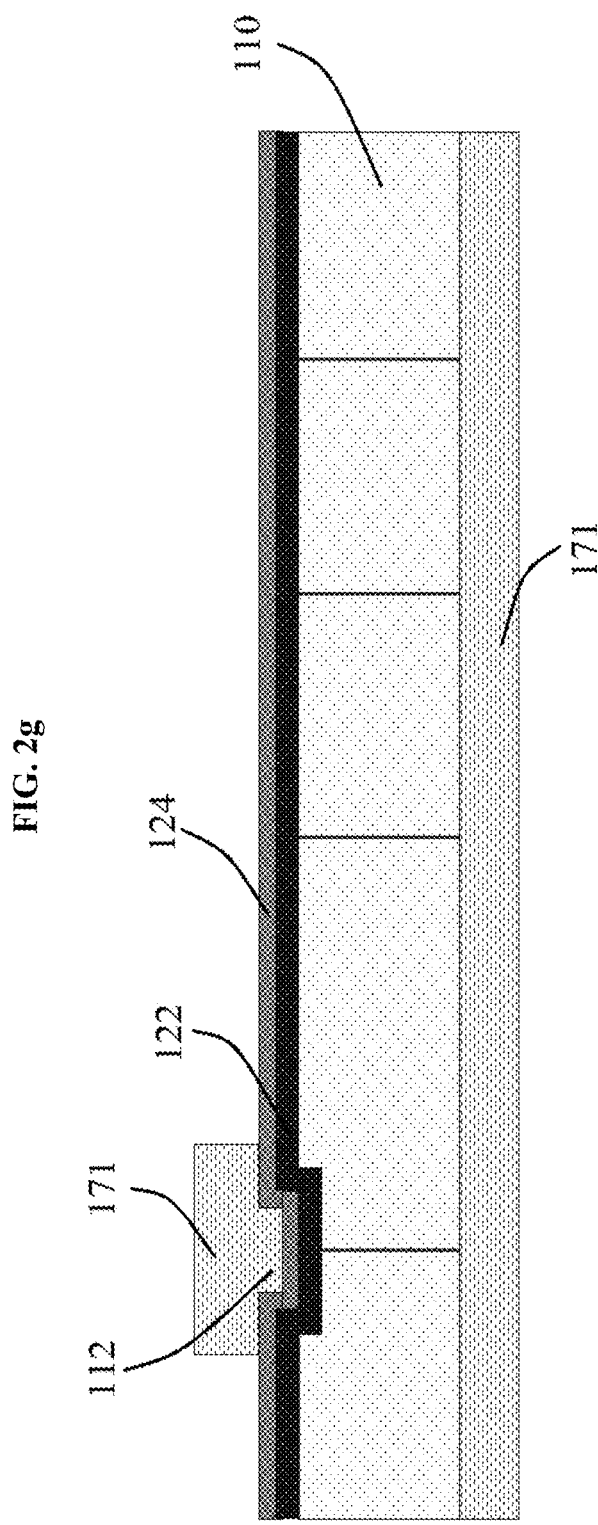

PASSIVE DEVICE PACKAGING STRUCTURE EMBEDDED IN GLASS MEDIUM AND METHOD FOR MANUFACTURING THE SAME

CROSS-REFERENCE TO RELATED APPLICATION

This application claims the benefit under 35 USC § 119(a) of Chinese Patent Application No. 202010819722.5, filed on Aug. 14, 2020, in the China Intellectual Property Office, the entire disclosure of which is incorporated herein by reference for all purposes.

BACKGROUND

1. Technical Field

The present invention relates to device packaging, and specifically to a passive device packaging structure embedded in a glass medium and having low loss and relay as well as a method for manufacturing the same.

2. Background of the Invention

With the vigorous development of the electronics industry, it is time for the electronic products to have multiple functions, miniaturized appearance and high performance. The increasing requirements on high density, multifunction and miniaturization bring new challenges to packages and substrates. Many new packaging technologies are developed accordingly, comprising the embedded package technology.

With the embedded package technology, passive devices (such as resistors, capacitors, inductors) or even active devices (such as IC) are embedded into the inside of the packaged substrate. This method can shorten the line length between elements and improve electrical characteristics, and also can improve effective PCB packaging area and reduce many welding points on the PCB surface, thus improving packaging reliability and lowering cost, and thus is a perfect high-density packaging technology.

A Chinese patent CN103985698B discloses a composite electronic structure wherein at least one capacitor and at least one inductor embedded in the polymer matrix are coupled by an upright Cu via pillar, achieving an embedded filter structure.

However, the above structure has the following disadvantages: (1) the capacitor and the inductor are placed in different stacking layers in a vertical direction such that the size miniaturization of the elements is affected; (2) the capacitor and the inductor are embedded in an ordinary polymer matrix which is difficult to be very low in dielectric constant Dk and dielectric loss Df, thus leading to problems of a relatively large signal loss and a relatively long transmission delay time of the electric signal, and is not suitable for high frequency products; (3) the used film capacitor, having a regular capacitor structure, is prone to be damaged in a harsh environment due to its relatively thin dielectric layer and is even shorted due to ion migration between upper and lower electrodes, thus being low in life and reliability; and (4) it is necessary in the production process to repetitively laminate the polymer dielectric to form an insulating layer embedded with the capacitor and inductor, complicated in processing and flow and high in cost.

Therefore, now there is a need for a passive device embedded structure having a low loss, a low relay, a small size and a high density for high frequency applications in industries of electronics, communication, etc.

SUMMARY

One of the objectives of the present invention is to provide the embodiments of the present invention involve providing a solution for a passive device packaging structure embedded in a glass medium as well as a method for manufacturing the same, to overcome the technical defect(s) in the prior art.

In a first aspect of the present invention, a passive device packaging structure embedded in a glass medium is provided, comprising: a glass substrate and at least one capacitor embedded in the glass substrate, wherein the capacitor comprises an upper electrode, a dielectric layer, and a lower electrode, wherein the glass substrate is provided on its upper surface with a cavity, the dielectric layer covers a surface of the cavity and has an area larger than that of the cavity, the upper electrode is provided on the dielectric layer, and the dielectric layer and the lower electrode are conductively connected by a metal via pillar passing through the glass substrate.

Preferably, the upper electrode has an area larger than that of the dielectric layer. Preferably, the lower electrode has an area equal to that of the dielectric layer.

In some embodiments, the dielectric layer is selected from a group comprising $Ta_2O_5$, $TiO_2$, $BaO_4SrTi$ and $Al_2O_3$, but it is not limited thereto.

In some embodiments, the upper electrode and the lower electrode comprise a Cu layer, but they are not limited thereto and may comprise Al, Ag, Au, Ti, Pt or other metal layer, for example.

Preferably, the metal via pillar comprises a Cu via pillar.

In some embodiments, on the upper and lower surfaces of the glass substrate, first and second wiring layers are formed, respectively. Preferably, the first and second wiring layers are connected by a Cu via pillar pass through the glass substrate.

In some embodiments, the packaging structure further comprises at least one inductor embedded in the glass substrate. Preferably, the at least one inductor comprises an annular Cu column embedded in the glass substrate. Preferably, the at least one capacitor and the at least one inductor are interconnected by the first wiring layer and/or the second wiring layer.

In a second aspect of the present invention, a method for manufacturing a passive device packaging structure embedded in a glass medium is provided, wherein the method comprises the following steps:
A. forming a cavity on an upper surface of a glass substrate;
B. applying a dielectric layer onto the cavity such that the dielectric layer completely covers the cavity;
C. forming a first seed layer on the upper surface of the glass substrate and the dielectric layer;
D. forming a first wiring layer on the first seed layer wherein the first wiring layer comprises an upper electrode above the dielectric layer;
E. forming a via-hole on a lower surface of the glass substrate; and
F. plating Cu on the lower surface of the glass substrate, forming a Cu via pillar filling the via-hole and a second wiring layer below the Cu via pillar, wherein the second wiring layer comprises a lower electrode conducted with the Cu via pillar.

In some embodiments, the step A further comprises:
a1. applying a first photoresist layer onto the upper surface of a glass substrate;

a2. patterning the first photoresist layer to form a cavity pattern;
a3. performing etching to the cavity pattern to form the cavity on the glass substrate; and
a4. removing the first photoresist layer.
Preferably, the step A further comprises:
a5. after removing the first photoresist layer, drilling the glass substrate by laser to form an etching guiding hole.
In some embodiments, the step B further comprises:
b1. sputtering the dielectric layer to the upper surface of the glass substrate;
b2. applying a thin Cu layer onto the dielectric layer;
b3. forming an etching resisting layer in a predetermined position on the thin Cu layer;
b4. performing etching to the thin Cu layer and the dielectric layer; and
b5. removing the etching resisting layer.
Preferably, the step b3 further comprises:
applying a second photoresist layer onto the thin Cu layer, and forming the etching resisting layer by exposure and development.
In some embodiments, the step D comprises:
d1. applying a third photoresist layer onto the first seed layer, and forming a first pattern by exposure and development;
d2. forming the first wiring layer in the first pattern by electroplating;
d3. removing the third photoresist layer; and
d4. performing etching to the first seed layer.
In some embodiments, the step E further comprises:
e1. applying a protection layer on the upper surface of the glass substrate; and
e2. performing etching to the etching guiding hole to form the via-hole, and revealing the dielectric layer below the glass substrate.
In some embodiments, the step F further comprises:
f1. applying a protection layer on the upper surface of the glass substrate;
f2. applying a second seed layer on the lower surface of the glass substrate;
f3. applying a fourth photoresist layer on the second seed layer, and forming a second pattern by exposure and development;
f4. forming the second wiring layer and the Cu via pillar filling the via-hole in the second pattern by electroplating, wherein the second wiring layer comprises the lower electrode conducted with the Cu via pillar; and
f5. removing the fourth photoresist layer and the protection layer.
Preferably, the dielectric layer is selected from a group comprising $Ta_2O_5$, $TiO_2$, $BaO_4SrTi$ and $Al_2O_3$, but it is not limited thereto.
In some embodiments, the step F further comprises: electroplating Cu in the via-hole of the glass substrate to form at least one inductor, wherein the at least one capacitor and the at least one inductor are interconnected by the first wiring layer and/or the second wiring layer.

BRIEF DESCRIPTION OF THE DRAWINGS

In order to better understand the present invention and illustrate the embodiments of the present invention, the accompanying drawings are referred to only in an exemplary way.
Specifically referring to the drawings now, it should be emphasized that the specific graphical representation is provided only in an exemplary way, and only for the purpose of illustrative discussion of the preferred embodiments of the present invention. The graphical representation is provided for the reason that the drawings are believed to be useful to make the description of the principles and concepts of the present invention understood easily. In this regard, it is intended to illustrate the structural details of the present invention only in a detail degree necessary to generally understand the present invention.

DETAILED DESCRIPTION

Figure 1:
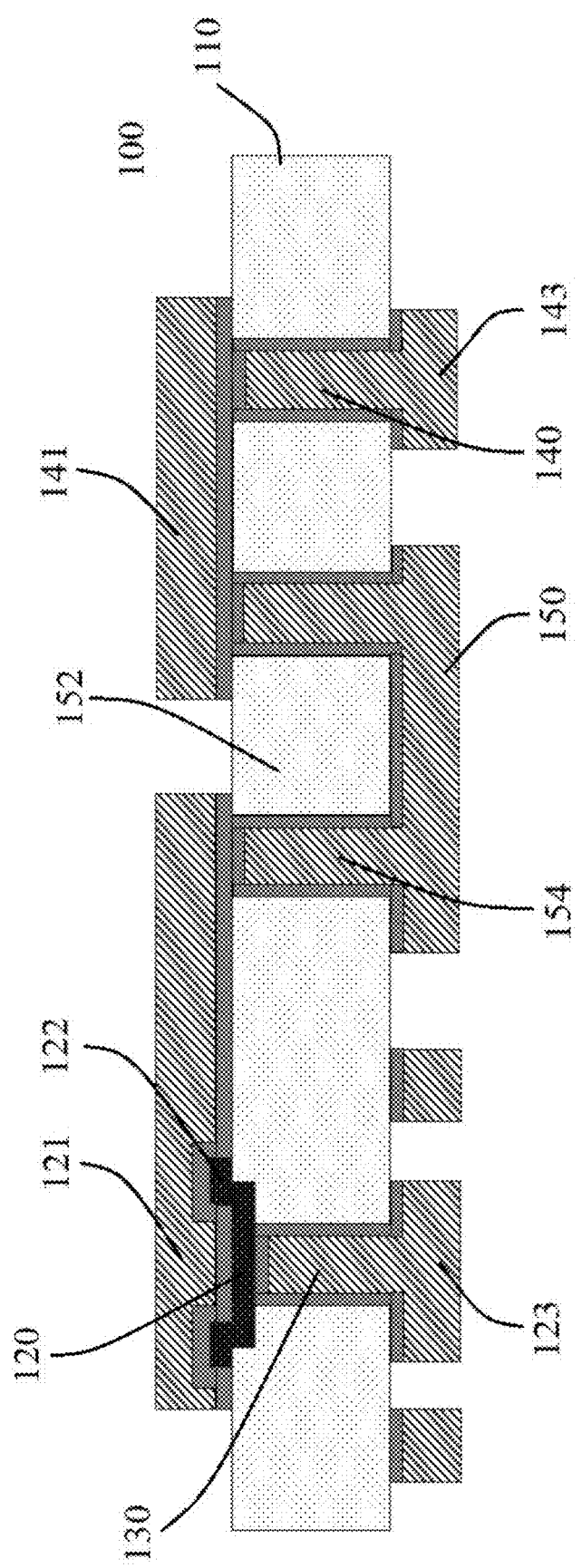
FIG. 1 is a schematic side view of a passive device packaging structure embedded in a glass medium according to an embodiment.

In order to make the objectives, technical solutions and advantages of the present invention clearer, the present invention will be further explained in detail in connection with specific embodiments and with reference to the accompanying drawings.
It should be noted that all the expressions of "first" and "second" as used herein are used to distinguish two different entities or parameters having the same name. As can be seen, the "first" and "second" are used only to facilitate expression, and should not be understood to limit the embodiments of the present invention. In addition, in order to make expression clear, the terms of "upper" and "lower" are expressed based on the orientation as shown in the drawings.
Referring to FIG. 1, it shows a schematic side view of a passive device embedded structure 100 embedded in a glass medium according to an embodiment. As shown in FIG. 1, the embedded structure 100 comprises a glass substrate 110 and at least one capacitor 120 embedded in the glass substrate 110, wherein the capacitor 120 comprises an upper electrode 121, a dielectric layer 122, and a lower electrode 123. The glass substrate 110 is provided on its upper surface with a cavity 112, the dielectric layer 122 covers a surface of the cavity 112 and has an area larger than that of the cavity 112 such that the dielectric layer 122 completely covers the cavity 112 and thus a glass step 114 is formed at an edge of the cavity 112. The upper electrode 121 is provided on the dielectric layer 122, and a metal via pillar 130 is formed below the dielectric layer 122 and is in contact with the dielectric layer 122. The lower electrode 123 is formed on a lower surface of the glass substrate 110 and is conductively connected with the metal via pillar 130 passing through the glass substrate 110.
The glass cavity 112 is selected in structure for the reason that the dielectric layer 122 of the capacitor 102 made by the glass cavity 112 can prevent ion migration of the metal electrode along the edge of the dielectric layer 122. With the presence of the glass step structure, any ion migration between the upper and lower electrodes of the capacitor can be avoided, improving the reliability of the capacitor.
Preferably, the upper electrode 121 has an area larger than that of the dielectric layer 122, and the lower electrode 123 has an area smaller than that of the dielectric layer 122. Preferably, the lower electrode 123 has an area equal to that of the cavity 112 such that the lower electrode 123 precisely corresponds to the cavity 112.
The dielectric layer 122 may be a ceramic dielectric, such as $Ta_2O_5$, $TiO_2$, $BaO_4SrTi$ or $Al_2O_3$.
The upper electrode 121 and the lower electrode 123 may be a Cu layer, or may comprise a metal layer, such as Al, Ag, Au, Ti, or Pt layer.

Preferably, the metal via pillar 130 is a Cu via pillar.

Preferably, on the upper and lower surfaces of the glass substrate 110, first and second wiring layers 141 and 143 may be formed, respectively. Preferably, the first and second wiring layers 141 and 143 are conductively connected by a Cu column 140 passing through the glass substrate 110.

Preferably, the upper electrode 121 and the first wiring layer 141 are formed in the same layer, while the lower electrode 123 and the second wiring layer 143 are formed in the same layer. That is, the upper electrode 121 and the lower electrode 123 may be included in the first wiring layer 141 and the second wiring layer 143, respectively, to form an interconnected circuit.

Preferably, the embedded structure 100 may further comprise at least one inductor 150 embedded in the glass substrate 110. The at least one inductor 150 may comprise an annular Cu column 154 embedded in the glass substrate 110. For example, the inductor 150 may comprise a core body 152 formed by etching the glass substrate 110 and an annular Cu column 154 surrounding the core body 152. Preferably, the at least one capacitor 120 and the at least one inductor 150 are interconnected by the first wiring layer 141 and/or the second wiring layer 143, to achieve a function of a filter, for example.

Layer building up may be performed to the embedded structure 100 to stack and construct an additional wiring layer to form a structure with multiple layers connected with each other, thus forming a package-on-package (PoP) structure.

Figure 2A:
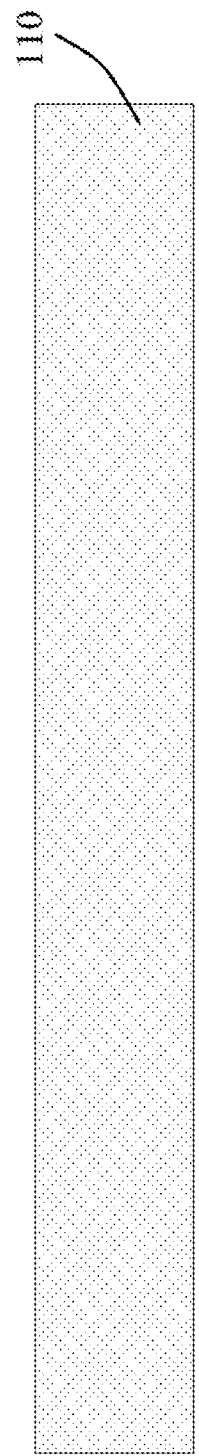
FIGS. 2a-2u schematically show schematic views of intermediate structures obtained by steps for manufacturing the passive device packaging structure of FIG. 1.
Figure 2B:
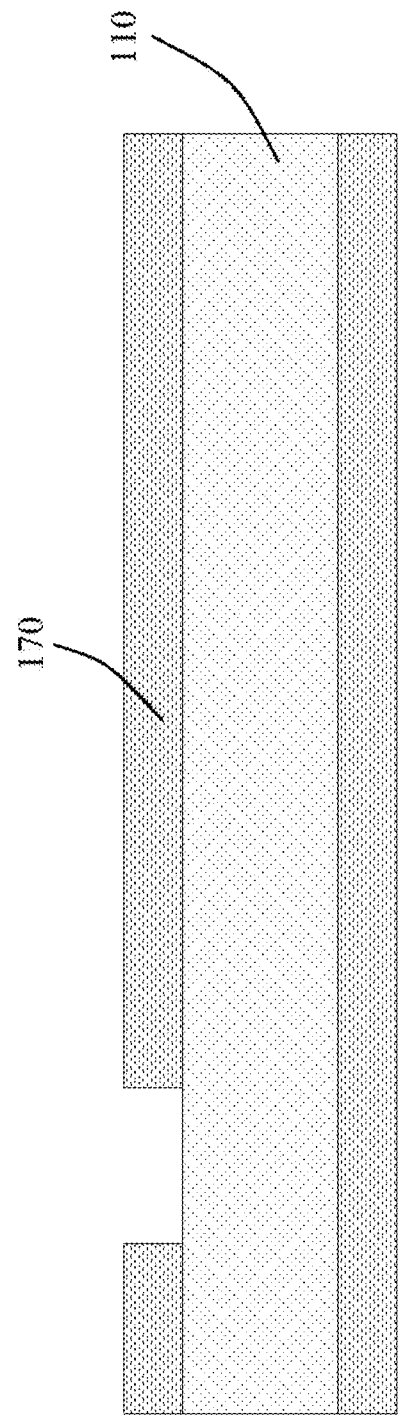
Figure 2E:
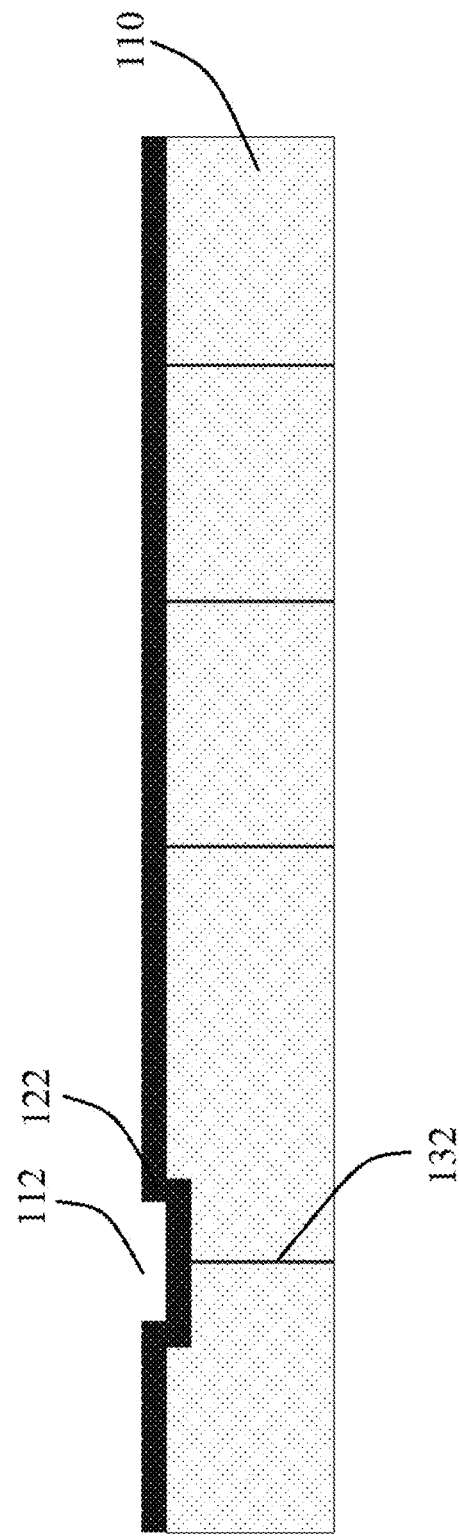
Figure 2F:
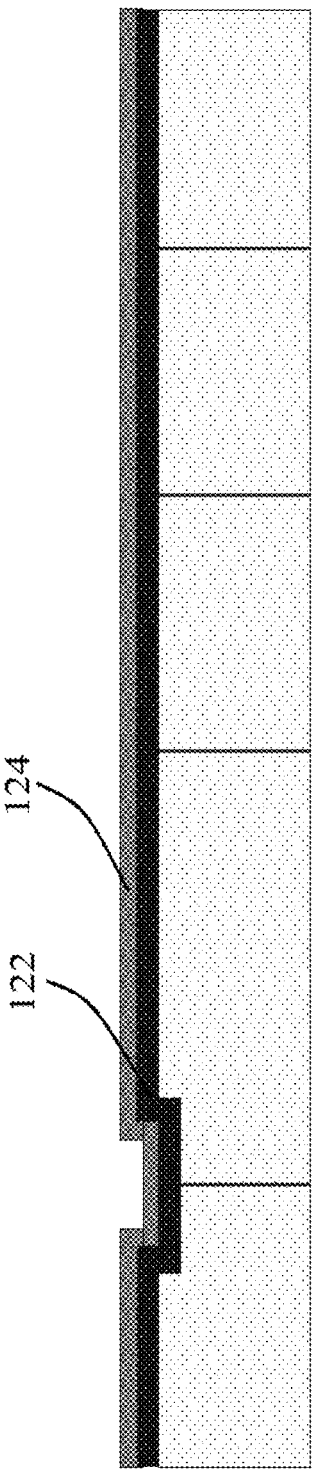
Figure 2H:
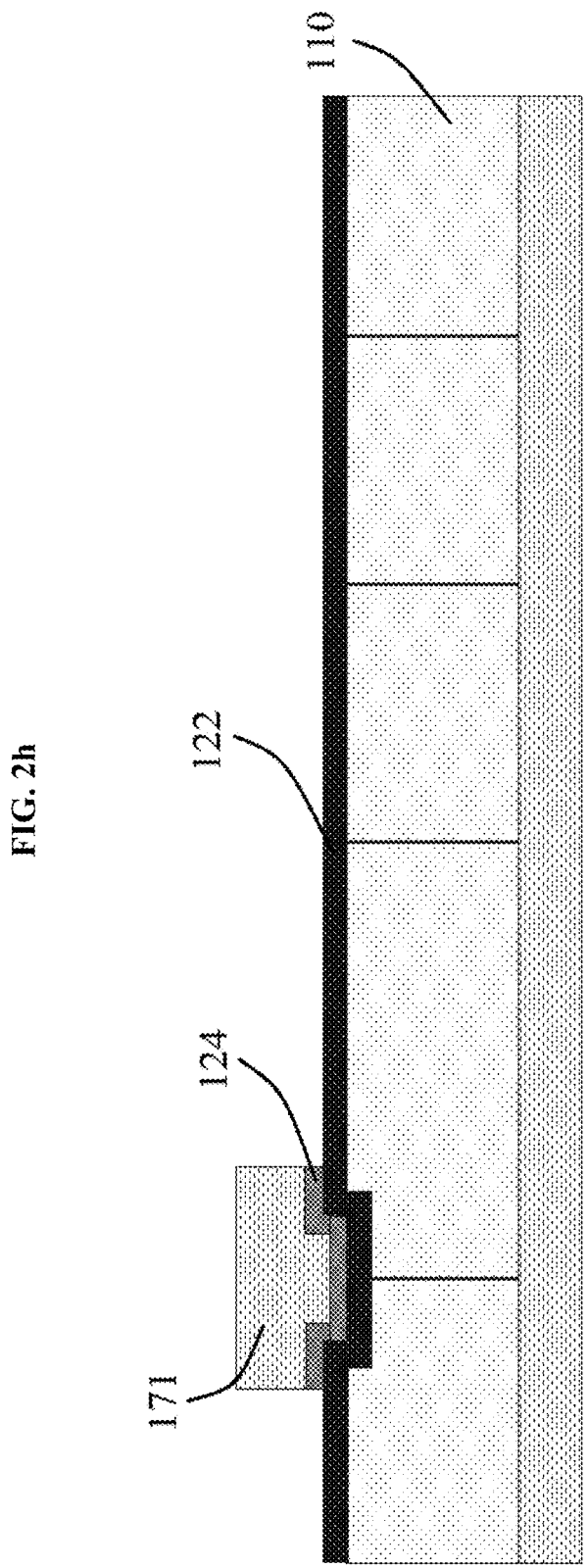
Figure 2I:
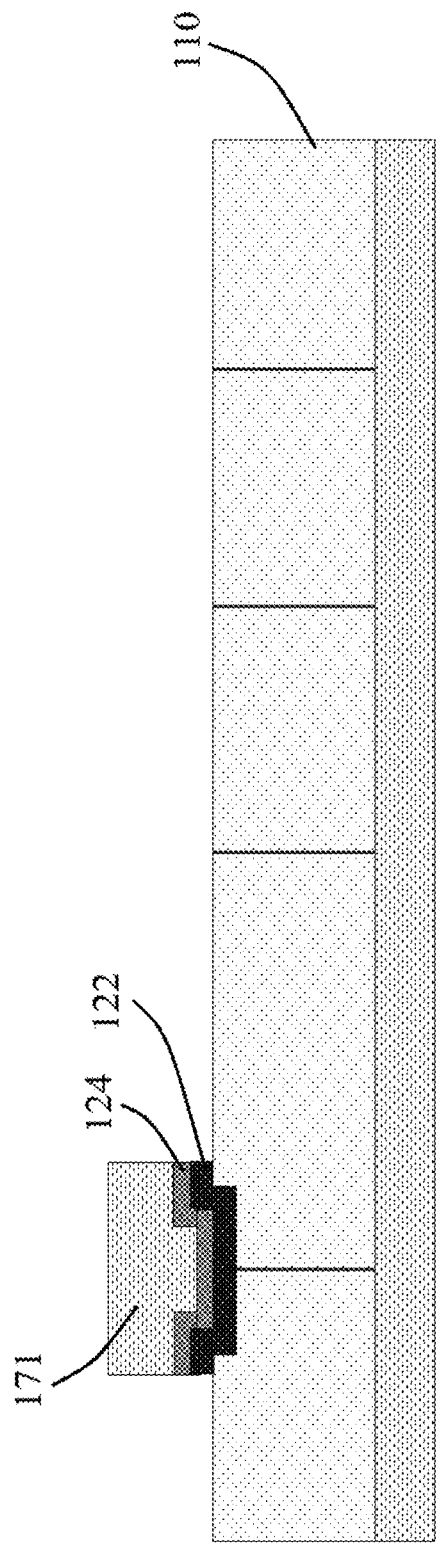
Figure 2J:
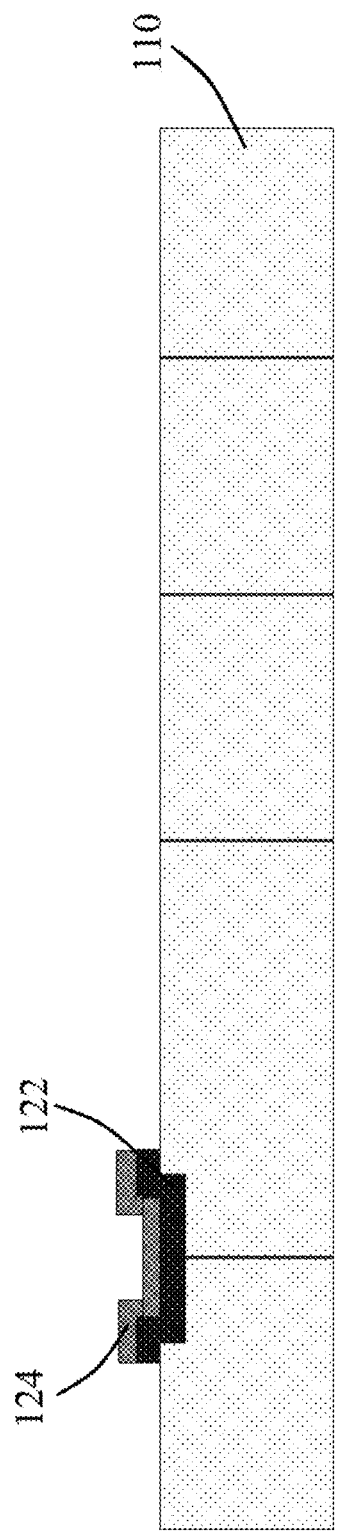
Figure 2K:
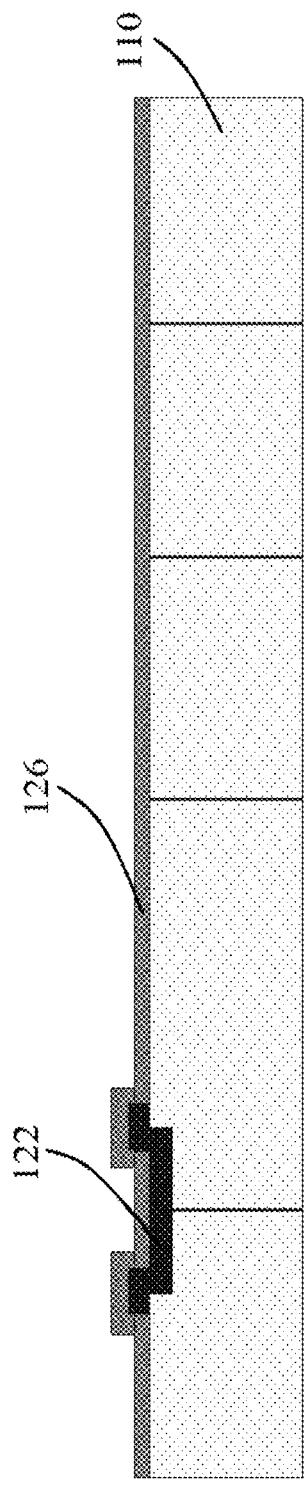
Figure 2L:
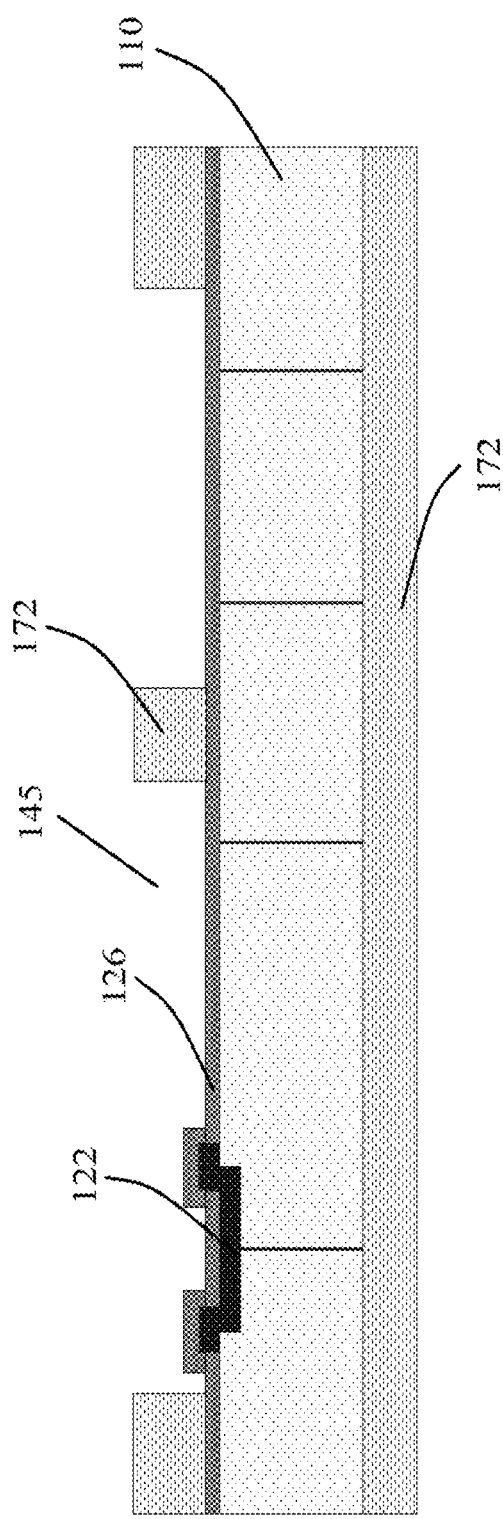
Figure 2M:
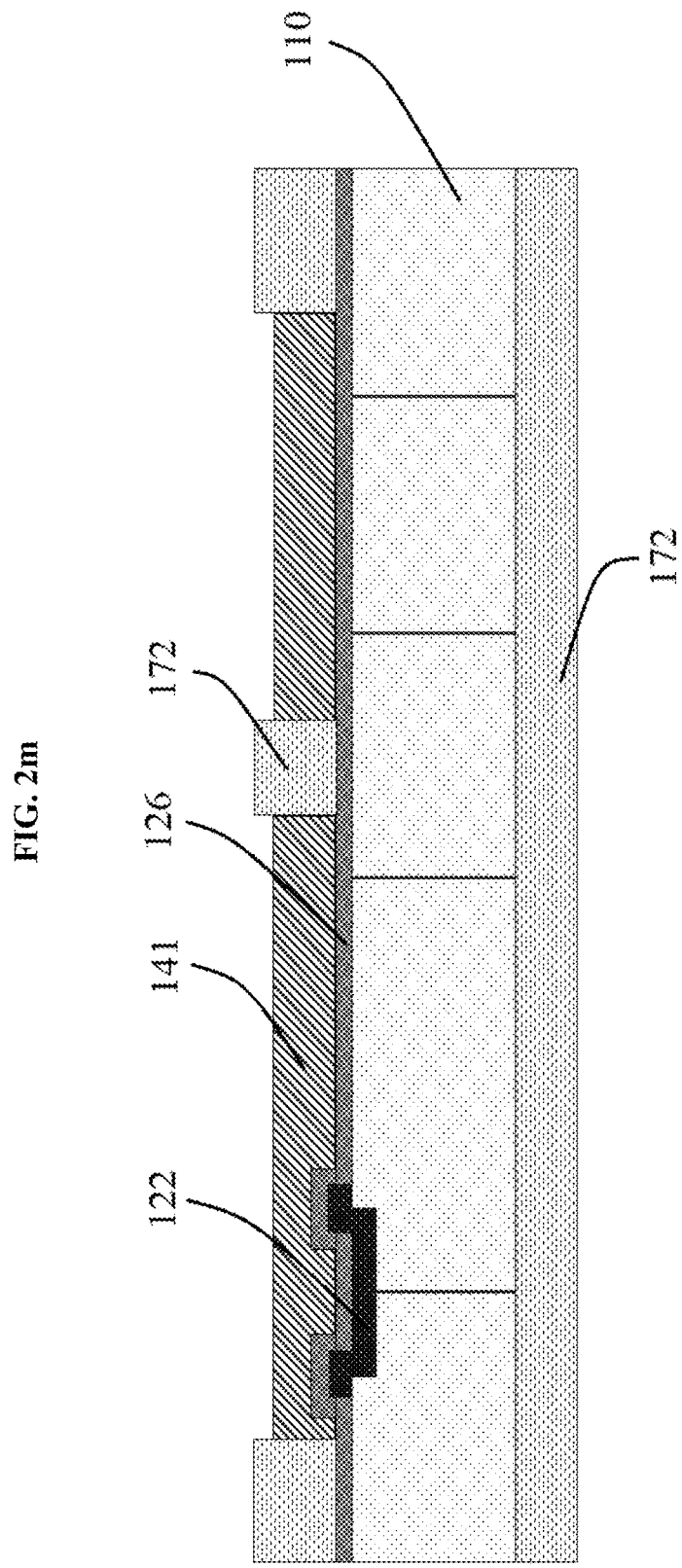
Figure 2N:
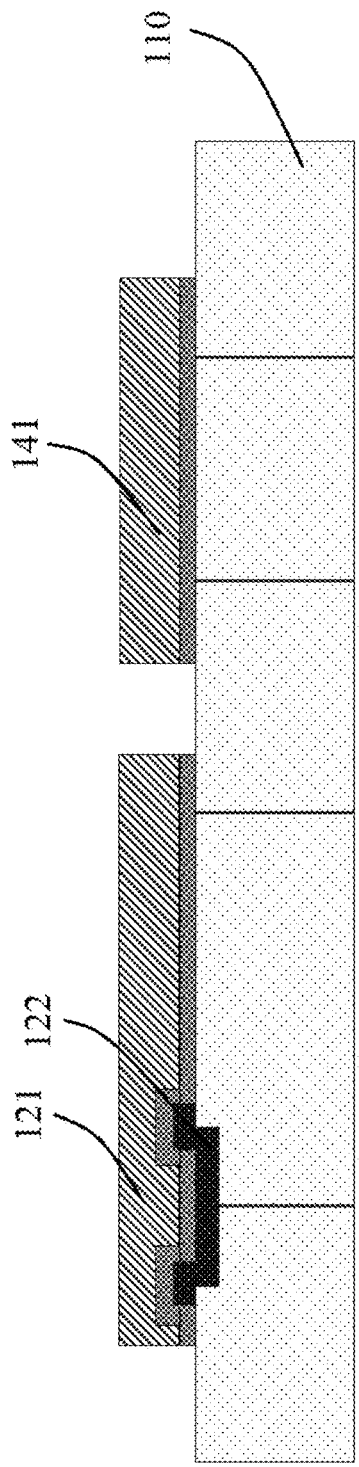
Figure 2O:
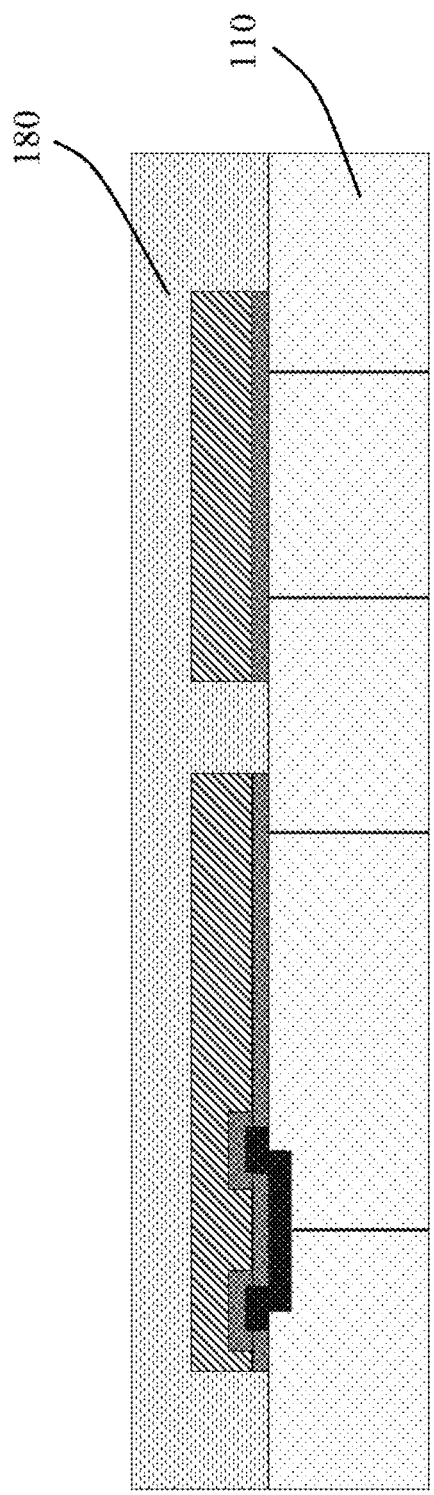
Figure 2P:
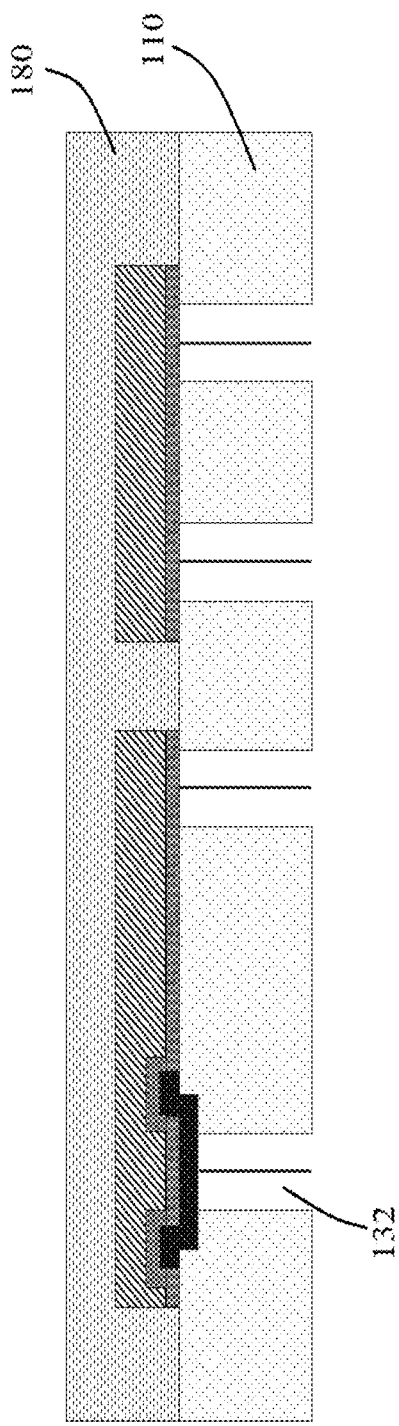
Figure 2Q:
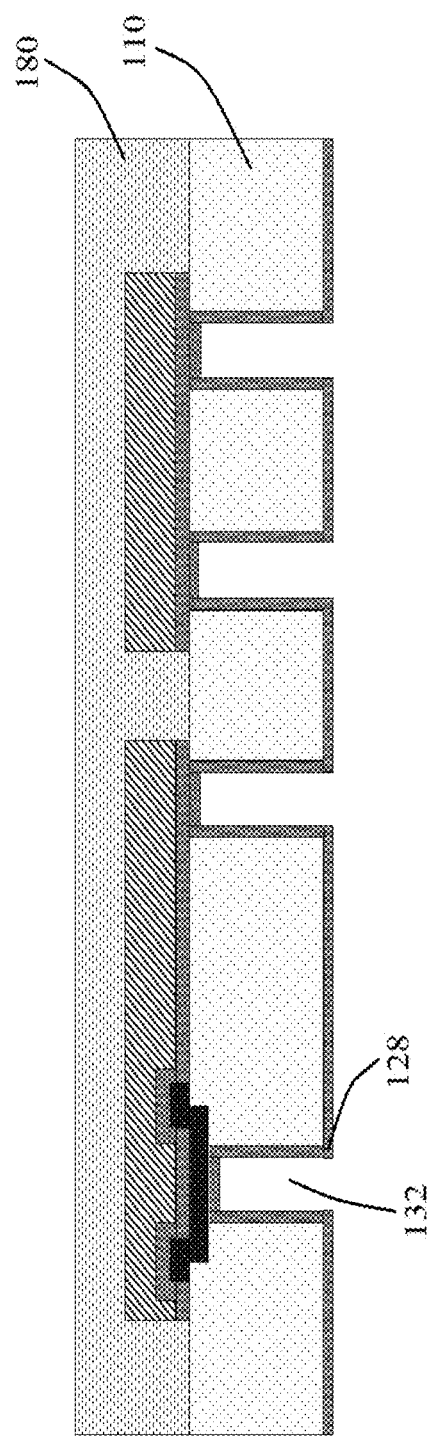
Figure 2R:
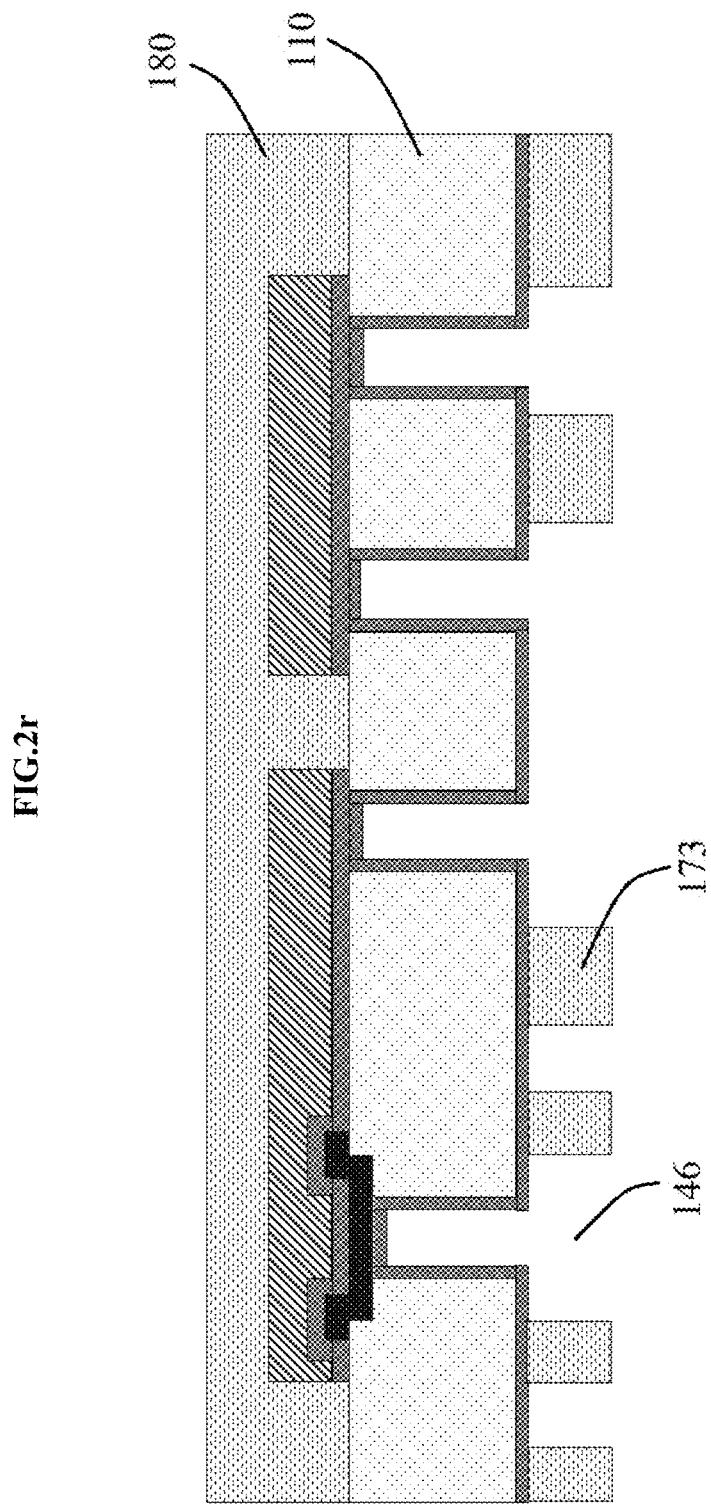
Figure 2S:
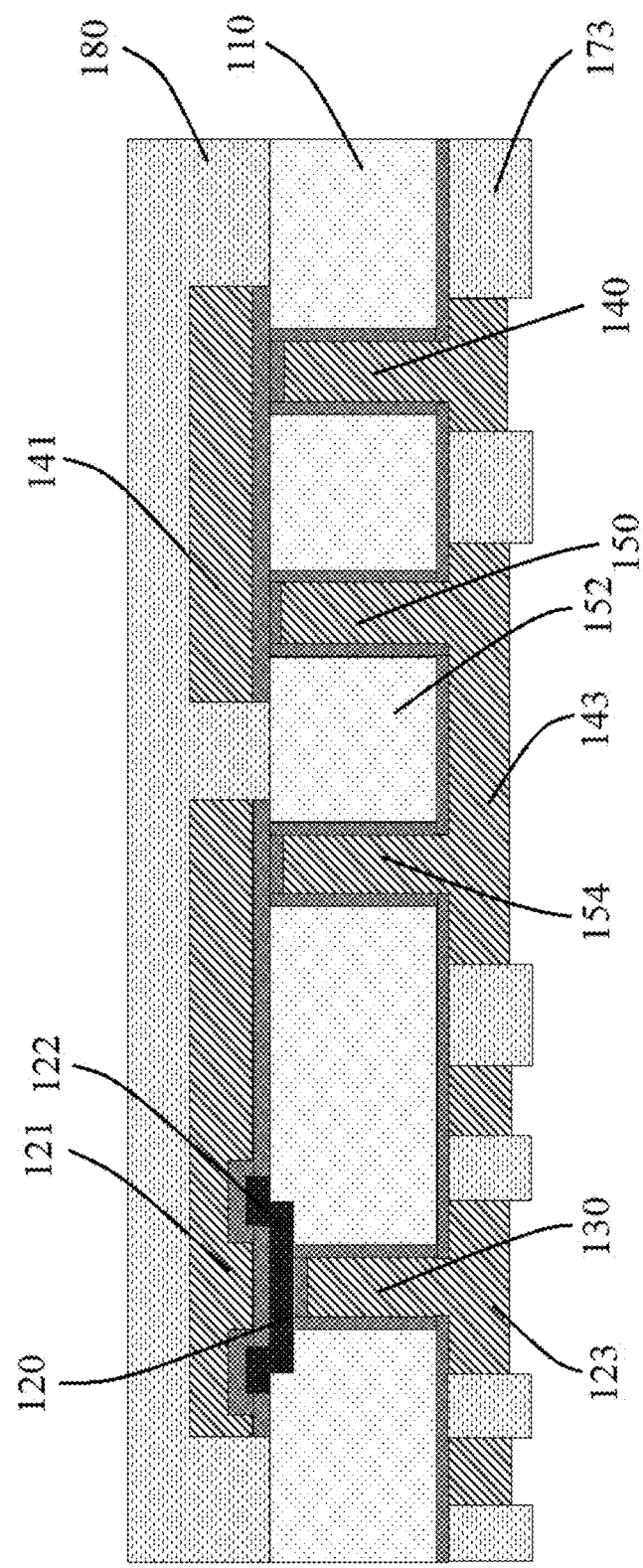
Figure 2T:
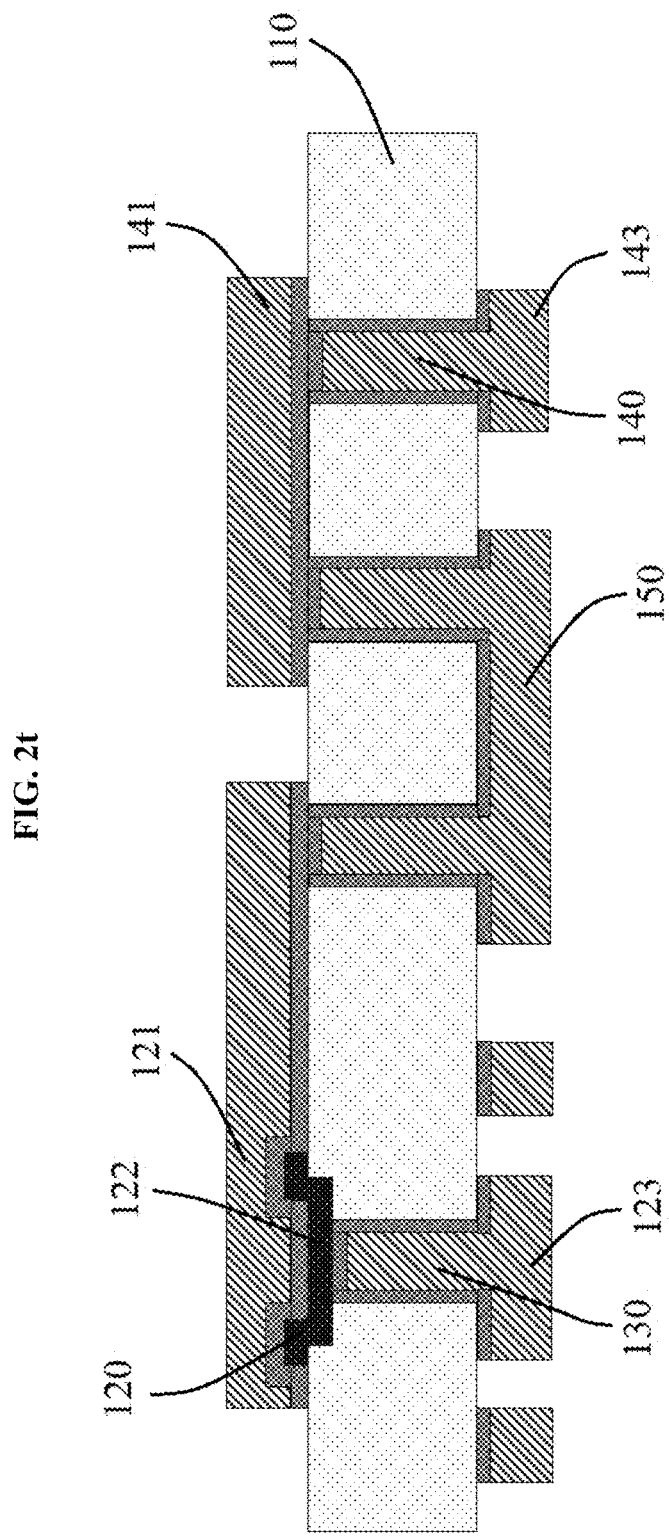
Figure 2U:
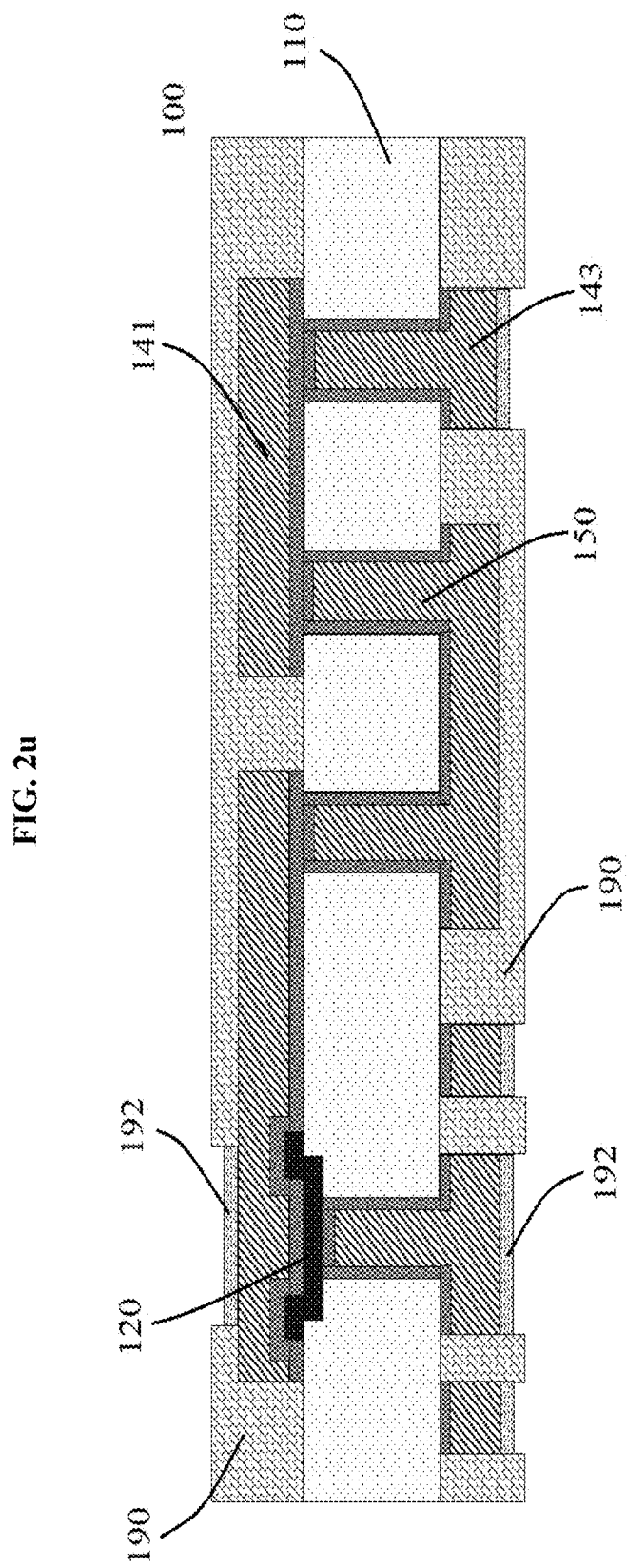

FIGS. 2a-2u schematically show schematic views of intermediate structures obtained by steps of a method for manufacturing the embedded structure 100 of FIG. 1.

Referring to FIG. 2a, starting from the glass substrate 110, it is used as an insulating layer. Therefore, in the present invention, the glass substrate 110 is directly used as an initial insulating layer, and this can significantly simplify the steps of constructing an insulating layer of an embedded device by means of a frame or a temporary bearing part as in the prior art. Moreover, as the dielectric constant Dk and dielectric loss Df of the glass medium are very low, it is possible to significantly reduce signal loss and signal relay of the embedded passive devices, such as the capacitor and the inductor, especially suitable for high frequency signal products.

Referring to FIG. 2b, photoresist layer 170, such as a dry film, is applied onto the upper and lower surfaces of the glass substrate 110, and a pattern having a window is formed on the upper surface of the glass substrate 110 by exposure and development.

Referring to FIG. 2c, with protection by the dry film on the upper and lower surfaces, the glass substrate 110 is etched to form a glass cavity 112. Then, the dry film 170 on the upper and lower surfaces are removed to achieve film removing.

The glass substrate 110 is generally a thin glass sheet having a thickness of 50-500 μm, and generally, machining the thin glass sheet in a traditional processing way of mechanical cutting and drilling will cause micro cracks and residual internal stress which may cause a lower product quality or even a device failure. Especially, as the glass material is fragile, it is difficult to process a structure having a high ratio of hole diameter to plate thickness, or the processing speed is too slow and thus the cost is too high. In the present invention, the technology of laser induced depth etching (LIDE) is used to form a via on the glass substrate in two steps. Firstly, based on the designed pattern, the glass to be processed is selectively modified by laser. The laser is used to modify the photochemical properties of the material to be processed in a range of full thickness such that it can be chemically etched selectively in the subsequent processes. Then, the glass substrate is chemically etched. As the material region with modification is etched much faster than that without modification, it is possible to precisely control the time period of the glass substrate in the etching bath to thus form the exact structural size consistent with the design requirement(s).

Referring to FIG. 2d, the first step of the technology of laser induced depth etching (LIDE) is performed wherein selective laser modification is performed in a predetermined hole position of the glass substrate 110 to form a laser modification region 132, as indicated by a vertical fine line in the figure.

Referring to FIG. 2e, next, a dielectric layer 122, such as a $Ta_2O_5$ layer, is sputtered onto the upper surface of the glass substrate 110 and the cavity 112.

Referring to FIG. 2f, a layer of Cu layer 124 is deposited on the dielectric layer 122 to improve the attaching force between the dielectric layer 122 and the metal layer.

Referring to FIG. 2g, a photoresist layer 171, such as dry film, is applied onto the upper and lower surfaces of the glass substrate 110, the pattern on the upper surface is transferred, and an etching resisting layer is formed in a position corresponding to the cavity 112 by exposure and development.

Referring to FIG. 2h, the revealed Cu layer 124 is etched off wherein a method of wet etching may be used.

Referring to FIG. 2i, the revealed dielectric layer 122 is removed.

Referring to FIG. 2j, the photoresist layer 171 is peeled, obtaining the dielectric layer 122 on the cavity 122 of the glass substrate 110.

Next, referring to FIG. 2k, a seed layer 126 is formed on the upper surface of the glass substrate 110. The seed layer 126 may comprise at least one of Ti, Ni, V, Cu, Al, W, Cr, Ag and Au.

Next, referring to FIG. 2l, a photoresist layer 172, such as dry film, is applied onto the upper and lower surfaces of the glass substrate 110. A first pattern 145 is formed on the upper surface of the glass substrate 110 by exposure and development. The dry film on the lower surface is cured to protect the lower surface of the glass substrate 110.

Next, referring to FIG. 2m, Cu is electroplated in the first pattern 145 to form a first wiring layer 141. In this step, an upper electrode 121 included in the first wiring layer 141 is simultaneously formed. The upper electrode 121 is covered on the dielectric layer 122 and has an area generally larger than that of the dielectric layer 122.

Next, referring to FIG. 2n, the photoresist layer 172 on the upper and lower surfaces of the glass substrate 110 is peeled.

Referring to FIG. 2o, a protection layer 180, which may be a protection dry film, for example, is applied on the upper surface of the glass substrate 110, to protect the first wiring layer 141 on the upper surface when the lower surface of the glass substrate 110 is processed.

Referring to FIG. 2p, a second step of the technology of laser inducing depth etching (LIDE) is performed wherein the glass substrate 110 is etched in a guided way to form a through glass via (TGV). Generally, it is possible to use wet etching, i.e., immersing the glass substrate 110 (with its upper surface being protected) into an etching liquid. As the glass region with laser modification is etched much faster than that without modification, the glass is guided for etching in the modified region to form a predetermined via 132. Alternatively, the etching may be achieved by dry etching. For example, the etching may be performed by the inductively coupled plasma (ICP) dry etching technology.

Referring to FIG. 2q, after the via 132 is formed by LIDE, a seed layer 128 is applied on the lower surface of the glass substrate 110. The seed layer 128 may comprise at least one of Ti, Ni, V, Cu, Al, W, Cr, Ag and Au. The seed layer 128 not only covers the lower surface of the glass substrate 110, but also covers an inner surface of the via 132.

Referring to FIG. 2r, a photoresist layer 173, such as dry film, is applied onto the seed layer 128. A second pattern 146 is formed on the lower surface of the glass substrate 110 by exposure and development.

Next, referring to FIG. 2s, Cu is electroplated for wiring in the second pattern 146 on the lower surface of the glass substrate 110, to form a second wiring layer 143. In this step, a lower electrode 123 included in the second wiring layer 143 and a Cu via pillar 130 filling the via 132 are simultaneously formed. The lower electrode 123 has an area preferably equal to that of the dielectric layer 122. Preferably, it is also possible to simultaneously form a conductive Cu column 140 conductively connecting the first wiring layer 141 and the second wiring layer 143. Preferably, it is also possible to simultaneously form at least one inductor 150 embedded in the glass substrate 110. The inductor 150 may be formed by etching the glass substrate 110 to form a via surrounding the core body 152 and then filling the via to form an annular Cu column 154 surrounding the core body 152. The inductor 150 may be connected into the circuit by the first wiring layer 141 and/or the second wiring layer 143, and thus can achieve a function of a filter formed by the capacitor 120 and the inductor 150. As the capacitor and the inductor can be provided in the same horizontal stacking layer of the embedded structure, the signal transmission path is shortened, not only lowering the parasitic inductance, but also significantly reducing the space for the structure of capacitor and inductor, thereby meeting the need of miniaturization of elements in the future.

Next, referring to FIG. 2t, the photoresist layer (dry film) 173 on the lower surface of the glass substrate 110 is removed, and then the revealed seed layer 128 is etched off. Finally, the protection layer (protection dry film) 180 on the upper surface of the glass substrate 110 is removed.

Finally, referring to FIG. 2u, it is possible to apply welding resisting layers 190 on the upper and lower surfaces of the glass substrate 110 and form revealed metal windows on the first wiring layer 141 and the second wiring layer 143. Alternatively, it is also possible to perform layer building up on the first wiring layer 141 and the second wiring layer 143 of the glass substrate 110 by further laminating insulating layers and forming wiring layers, thus obtaining an embedded structure having multiple layers interconnected. In addition, it is also possible to perform metal surface processing to the revealed metal window to form a metal protection layer 192 which may include an organic solderability preservative (OSP) film or an electroless Ni electroless Pd immersion gold (ENEPIG) layer, for example, to prevent oxidation of the metal surface of the wiring layer.

The glass substrate 110 may be a large panel to simultaneously form a device package array. In the final processing, the panel package array can be divided to obtain individual packages. The dividing or cutting may be achieved by using a rotating saw blade or other cutting technologies, such as using a laser.

With the illustration of the preferred embodiments, those skilled in the art can appreciate that the defects in the prior art have been solved by the present invention and the unexpected technical effect(s) can be achieved.

In the present invention, the glass medium is directly used as a carrying/bearing plate and an insulating layer, greatly simplifying the processing in the prior art to use a frame or frameless method to achieve embedding passive devices, such as a capacitor or an inductor, into an insulating layer, and significantly lowering the processing cost. Moreover, in the present invention, it is possible to provide a capacitor and an inductor in the same horizontal stacking layer, the signal transmission path is shortened, not only lowering the parasitic inductance, but also significantly reducing the space for the structure of capacitor and inductor, thereby meeting the need of miniaturization of elements in the future. In addition, in the present invention, the glass cavity is used to form the dielectric layer of the capacitor. The glass step structure is used to prevent ion migration between the upper and lower electrodes of the capacitor, improving the reliability of the capacitor. Finally, the capacitor and the inductor are embedded in the glass medium. As the dielectric constant Dk and dielectric loss Df of the glass medium are very low, the signal loss and the signal relay can be significantly reduced, especially suitable for high frequency signal products.

It will be appreciated by those skilled in the art that the present invention is not limited to the contents as specifically illustrated and described above. Moreover, the scope of the present invention is defined by the appended claims, comprising combinations and sub-combinations of the various technical features as described above as well as the variations and modifications thereof, which can be anticipated by those skilled in the art by reading the above description.

What is claimed is:

1. A passive device packaging structure embedded in a glass medium, comprising:
   a glass substrate; and
   at least one capacitor embedded in the glass substrate, the at least one capacitor comprising:
      an upper electrode;
      a dielectric layer; and
      a lower electrode,
   wherein the glass substrate is provided on its upper surface with a cavity;
   the dielectric layer covers a surface of the cavity and has an area larger than that of the cavity;
   the upper electrode is provided on the dielectric layer; and
   the dielectric layer and the lower electrode are conductively connected by a metal via pillar passing through the glass substrate.

2. The passive device packaging structure according to claim 1, wherein the upper electrode has an area larger than that of the dielectric layer.

3. The passive device packaging structure according to claim 1, wherein the lower electrode has an area equal to that of the cavity.

4. The passive device packaging structure according to claim 1, wherein the dielectric layer is selected from a group consisting of $Ta_2O_5$, $TiO_2$, $BaO_4SrTi$ and $Al_2O_3$.

5. The passive device packaging structure according to claim 1, wherein the upper electrode and the lower electrode comprise a Cu layer.

6. The passive device packaging structure according to claim 1, wherein the metal via pillar comprises a Cu via pillar.

7. The passive device packaging structure according to claim 1, wherein on the upper and lower surfaces of the glass substrate, first and second wiring layers are formed, respectively.

8. The passive device packaging structure according to claim 1, wherein the packaging structure further comprises at least one inductor embedded in the glass substrate.

9. The passive device packaging structure according to claim 1, wherein the at least one inductor comprises an annular Cu column embedded in the glass substrate.

10. The passive device packaging structure according to claim 8, wherein the at least one capacitor and the at least one inductor are interconnected by the first wiring layer and/or the second wiring layer.

11. A method for manufacturing a passive device packaging structure embedded in a glass medium, the method comprising:
    forming a cavity on an upper surface of a glass substrate;
    applying a dielectric layer onto the cavity such that the dielectric layer completely covers the cavity;
    forming a first seed layer on the upper surface of the glass substrate and the dielectric layer;
    forming a first wiring layer on the first seed layer wherein the first wiring layer comprises an upper electrode above the dielectric layer;
    forming a via-hole on a lower surface of the glass substrate; and
    plating Cu on the lower surface of the glass substrate, forming a Cu via pillar filling the via-hole and a second wiring layer below the Cu via pillar, wherein the second wiring layer comprises a lower electrode conducted with the Cu via pillar.

12. The method according to claim 11, wherein the forming of the cavity comprises:
    applying a first photoresist layer onto the upper surface of a glass substrate;
    patterning the first photoresist layer to form a cavity pattern;
    performing etching to the cavity pattern to form the cavity on the glass substrate; and
    removing the first photoresist layer.

13. The method according to claim 11, wherein the forming of the cavity comprises:
    after removing the first photoresist layer, drilling the glass substrate by laser to form an etching guiding hole.

14. The method according to claim 11, wherein the applying of the dielectric layer comprises:
    sputtering the dielectric layer to the upper surface of the glass substrate;
    applying a thin Cu layer onto the dielectric layer;
    forming an etching resisting layer in a predetermined position on the thin Cu layer;
    performing etching to the thin Cu layer and the dielectric layer; and
    removing the etching resisting layer.

15. The method according to claim 14, wherein the forming of the etching resisting layer comprises:
    applying a second photoresist layer onto the thin Cu layer, and forming the etching resisting layer by exposure and development.

16. The method according to claim 11, wherein the forming of the first wiring layer comprises:
    applying a third photoresist layer onto the first seed layer, and forming a first pattern by exposure and development;
    forming the first wiring layer in the first pattern by electroplating;
    removing the third photoresist layer; and
    performing etching to the first seed layer.

17. The method according to claim 13, wherein the forming of the via-hole comprises:
    applying a protection layer on the upper surface of the glass substrate; and
    performing etching to the etching guiding hole to form the via-hole, and revealing the dielectric layer below the glass substrate.

18. The method according to claim 11, wherein the plating of the Cu comprises:
    applying a protection layer on the upper surface of the glass substrate;
    applying a second seed layer on the lower surface of the glass substrate;
    applying a fourth photoresist layer on the second seed layer, and forming a second pattern by exposure and development;
    forming the second wiring layer and the Cu via pillar filling the via-hole in the layer pattern by electroplating, wherein the second wiring layer comprises the lower electrode conducted with the Cu via pillar; and
    removing the fourth photoresist layer and the protection layer.

19. The method according to claim 11, wherein the dielectric layer comprises $Ta_2O_5$.

20. The method according to claim 11, wherein the plating of the Cu comprises:
    electroplating the Cu in the via-hole of the glass substrate to form an inductor connecting the first wiring layer and/or the second wiring layer.

* * * * *